United States Patent

Mogi et al.

[11] Patent Number: 5,805,231
[45] Date of Patent: Sep. 8, 1998

[54] PHASE SYNCHRONIZING METHOD AND CIRCUIT

[75] Inventors: Yasuhide Mogi, Kanagawa; Etsuro Yamauchi, Tokyo, both of Japan

[73] Assignee: Sony Corporation, Tokyo, Japan

[21] Appl. No.: 750,903

[22] PCT Filed: Apr. 19, 1996

[86] PCT No.: PCT/JP96/01072

§ 371 Date: Dec. 19, 1996

§ 102(e) Date: Dec. 19, 1996

[87] PCT Pub. No.: WO96/33557

PCT Pub. Date: Oct. 24, 1996

[30] Foreign Application Priority Data

Apr. 21, 1995 [JP] Japan ................................. 7-097263

[51] Int. Cl.⁶ .................................................. H04N 5/06
[52] U.S. Cl. ........................................... 348/523; 348/536
[58] Field of Search ................................. 348/523, 521, 348/524, 522, 536, 537, 538, 539, 540, 541, 542, 543, 544, 545, 546, 547, 548, 549, 500; 358/150; H04N 5/06

[56] References Cited

U.S. PATENT DOCUMENTS 4,122,488 10/1978 Mikado .................................. 348/523
5,181,116 1/1993 Nakagaki et al. .................... 348/523

FOREIGN PATENT DOCUMENTS 62-73805 4/1987 Japan .
63-33925 2/1988 Japan .
64-44194 2/1989 Japan .
3-5966 11/1991 Japan .

*Primary Examiner*—Chris Grant
*Attorney, Agent, or Firm*—Frommer Lawrence & Haug LLP; William S. Frommer

[57] ABSTRACT

A digital sine wave signal is read form a memory storage of a phase synchronizing apparatus and is converted into an analog signal through a digital to analog converter. This converted analog sine wave is phase compared to an input analog sine wave supplied to an input terminal of the synchronization apparatus. The phase of the digital sine wave is synchronized with that of the input analog sine wave by controlling a read address signal of the memory storage based upon a detected phase error signal between the input analog sine wave and the converted analog sine wave. Thus, a desired digital signal synchronized with the phase of an input signal can be generated by a simple arrangement by digital processing.

3 Claims, 4 Drawing Sheets

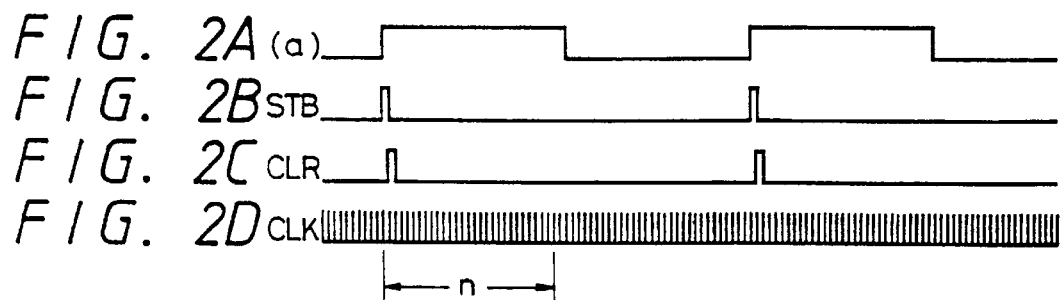
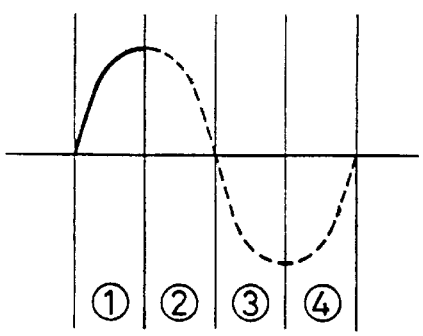
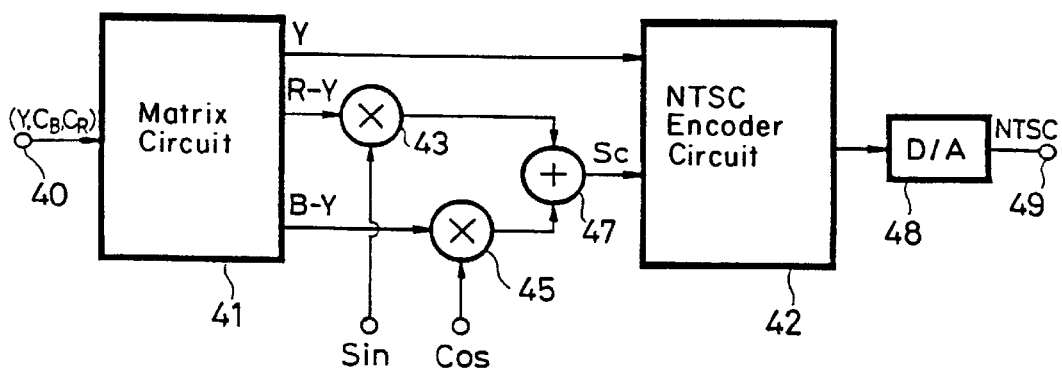

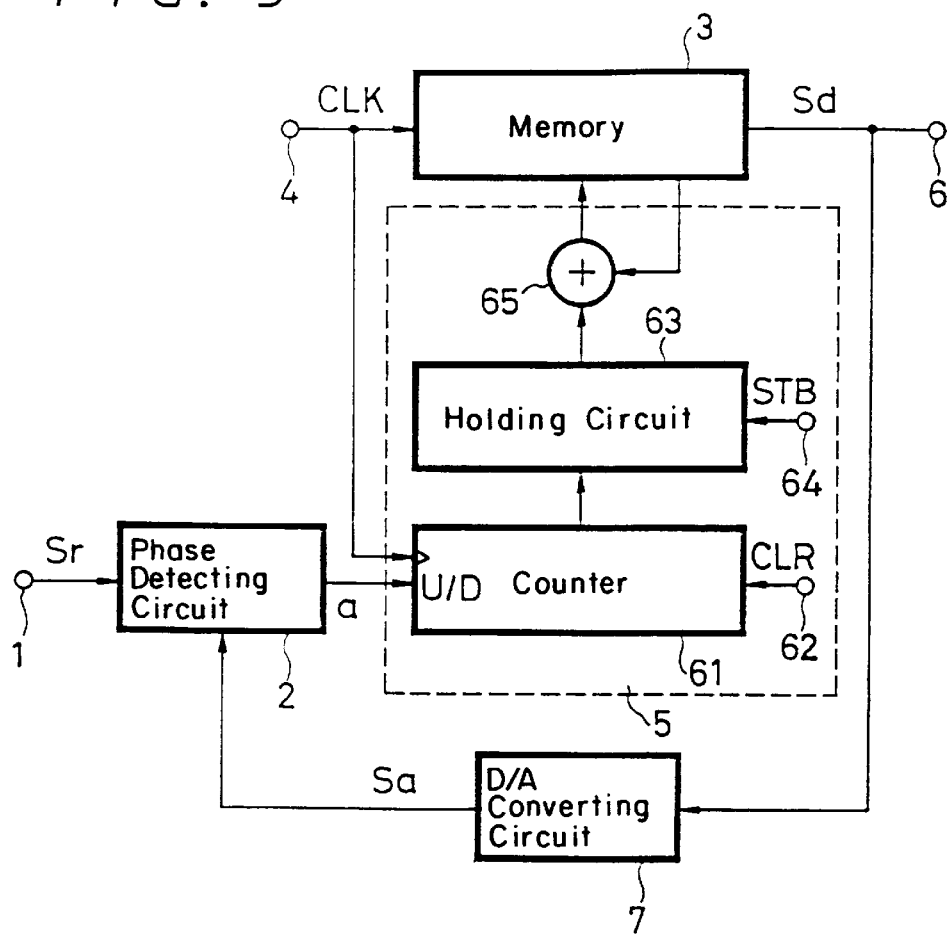
FIG. 5
FIG. 6B STB
FIG. 6C CLR
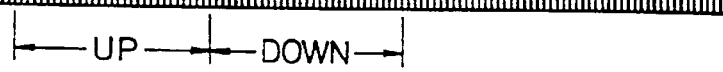FIG. 6D CLK

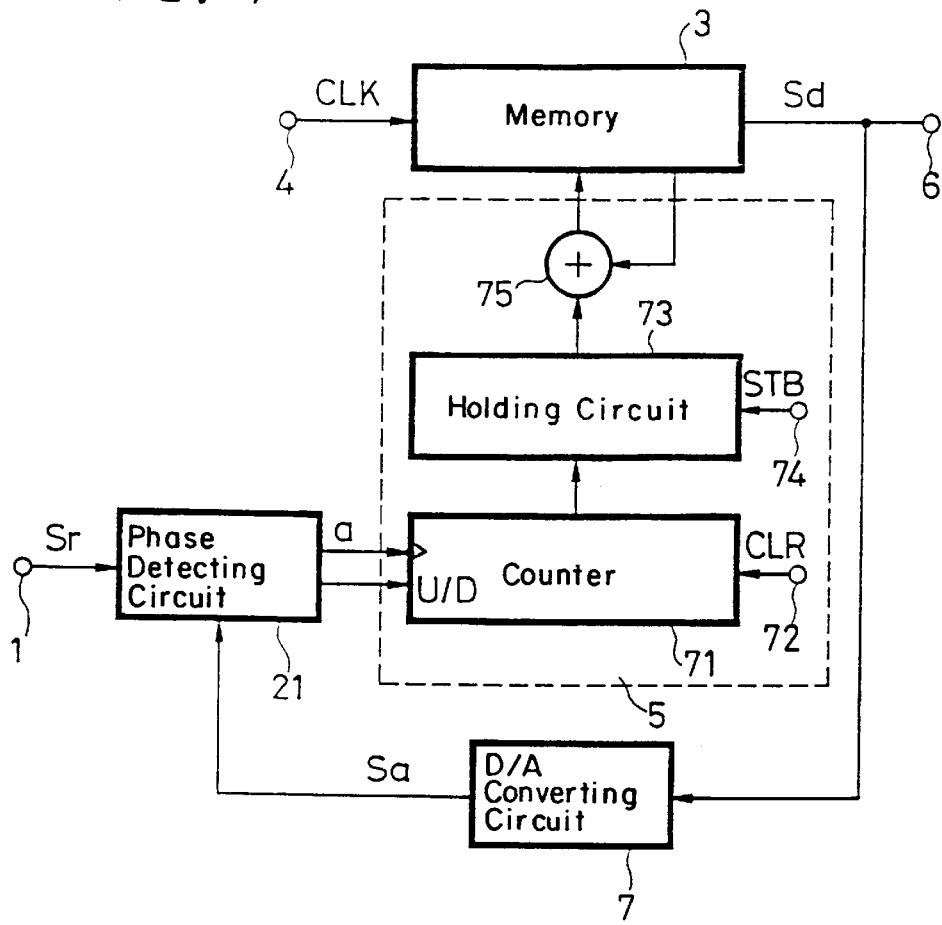
FIG. 7
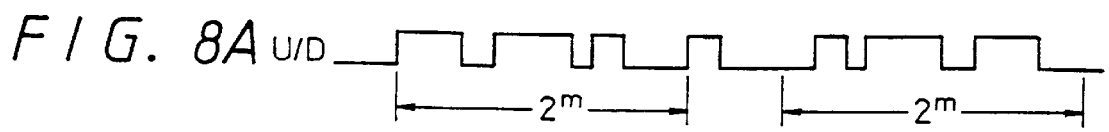
FIG. 8A U/D
FIG. 8B (a)
FIG. 8C STB
FIG. 8D CLR

PHASE SYNCHRONIZING METHOD AND CIRCUIT

TECHNICAL FIELD

The present invention relates to phase synchronizing method and circuit for use in synchronizing phases of video signals, for example, and particularly to phase synchronizing method and circuit used to form a desired signal synchronized with a phase of an inputted signal by digital signal processing.

BACKGROUND ART

When a plurality of video signals are synthesized, phases of synchronizing signals of a plurality of video signals to be synthesized should be synchronized. As phase synchronizing method and circuit used to synchronize phases of video signals, for example, techniques disclosed in Japanese laid-open patent publication No. 64-1147 and Japanese laid-open patent publication No. 1-190176 have hitherto been proposed.

Specifically, according to Japanese laid-open patent publication No. 64-11477, for example, a first video signal is converted into digital data and sequentially stored in three memory means. Then, these memory means are read in synchronism with a second video signal, whereby the first video signal stored in these memory means are synchronized with the second video signal. Therefore, the first and second video signals can be synthesized.

However, according to Japanese laid-open patent publication No. 64-11477, although the first and second video signals are synchronized in synchronizing signal level, a color subcarrier signal with a higher frequency cannot be synchronized at all so that color signals cannot be synthesized. Color signals can be synthesized only when the first video signal, for example, is a luminance signal (black and white signal).

On the other hand, according to Japanese laid-open patent publication No. 1-190176, RGB signals are decoded from the first and second video signals and stored in the first and second frame memories in accordance with respective synchronizing signals. These frame memories are read in synchronism with any one of the video signals, the first and second video signals thus read are synthesized in the state of the RGB signals, and the composite video signals are encoded again from the synthesized RGB signals.

According to the above-mentioned arrangement, since the video signals are synthesized in the form of RGB signals, a problem of synchronization of color subcarrier signal does not occur. However, according to this arrangement, three systems for RGB should be provided in the circuit arrangement from the A/D converters 61c, 62c to the D/A converter 72 so that the circuit arrangement becomes extremely large.

When the composite video signal are synthesized, phase-synchronization of color subcarrier signal should be made. In that case, although a so-called PLL based on analog processing is used in the prior art, this requires complex circuit elements such as oscillator. Moreover, there were problems of fluctuation of characteristics and unstableness due to the analog processing.

Video signals are more and more digitized in recent digital television broadcasting or the like. Therefore, in the digital signal processing, it is requested to realize the phase-synchronization based on the digital signal processing.

In view of the aforesaid aspect, it is an object of this application to provide a phase synchronizing method and circuit in which a desired signal synchronized with the phase of the inputted signal can be formed with a simple arrangement by digital signal processing.

DISCLOSURE OF INVENTION

According to the present invention, there is provided a method which comprises the steps of having memory means in which a desired signal waveform is stored, reading out the desired signal waveform from the memory means, phase-comparing an inputted signal with an arbitrary frequency and a signal with the desired signal waveform read out from the memory means and synchronizing a phase of the signal with the desired signal waveform read out from the memory means with a phase of the inputted signal with the arbitrary frequency by controlling a read address signal of the memory means based on a phase error signal detected by the phase-comparison. In association therewith, there are disclosed phase-synchronizing method and circuit.

BRIEF DESCRIPTION OF THE DRAWINGS

FIG. 2 is a timing chart used to explain a manner in which an address generating circuit of FIG. 1 generates an address signal.

FIG. 3 is a diagram used to explain a manner in which an arbitrary signal waveform is generated when a phase-synchronized signal is generated.

FIG. 4 is a block diagram showing an arrangement which generates a color subcarrier signal by using a phase-synchronized signal.

FIG. 5 is a block diagram showing a phase synchronizing circuit according to a second embodiment of the present invention.

FIG. 7 is a block diagram showing a phase synchronizing circuit according to a third embodiment of the present invention.

FIG. 8 is a timing chart used to explain a manner in which an address generating circuit of FIG. 7 generates an address signal.

BEST MODE FOR CARRYING OUT THE INVENTION

Phase-synchronizing method and circuit according to the present invention will hereinafter be described in detail with reference to the drawings.

The present invention intends to generate a desired signal synchronized with a phase of an inputted signal by digital signal processing. Therefore, according to the present invention, a signal is read out from a memory means, and an inputted signal and the signal read out from the memory means are phase-compared. Then, the phase of the signal read out from the memory means is synchronized with the phase of the inputted signal by controlling a read address signal of the memory means based on a detected phase error signal.

Figure 1:
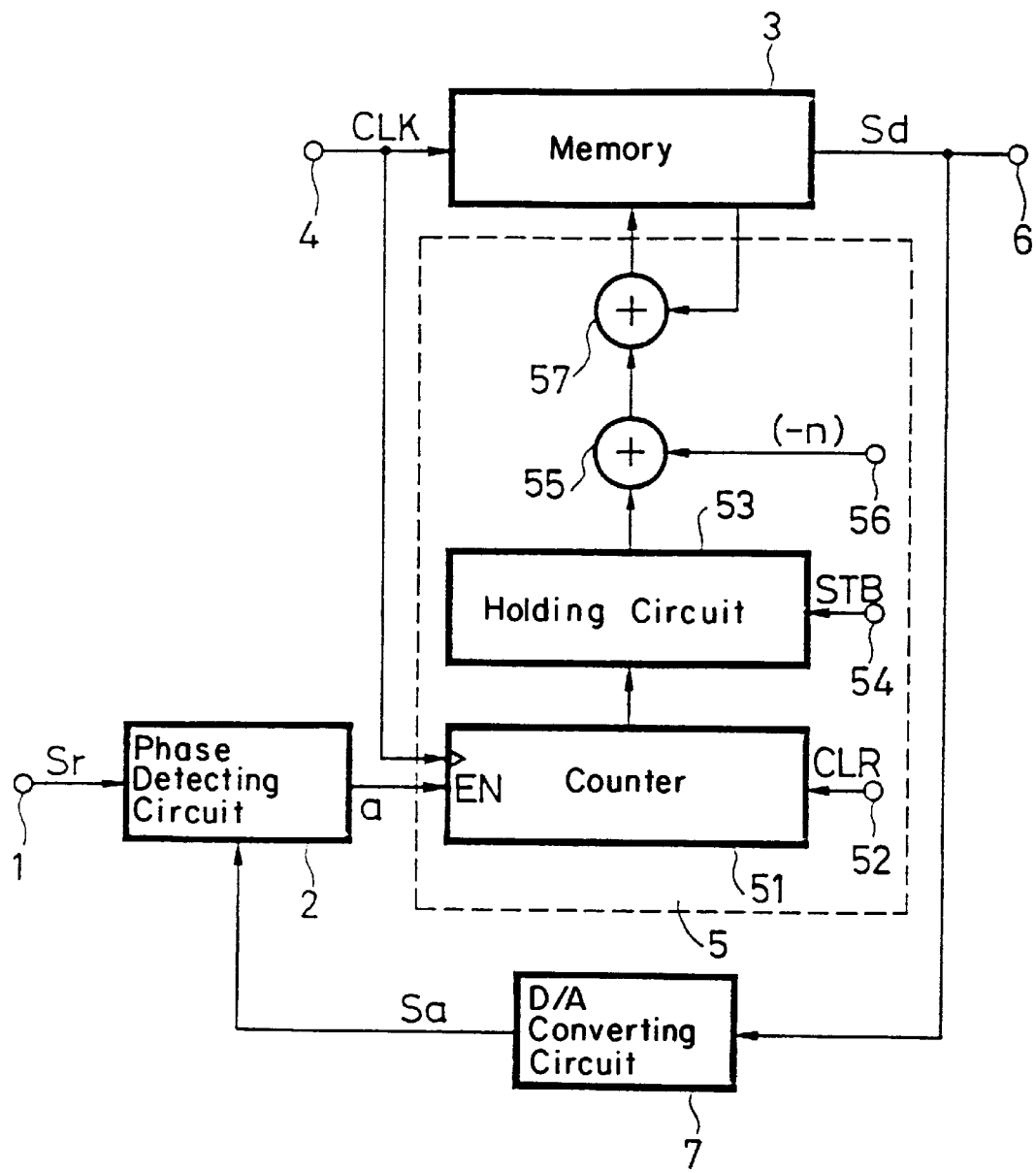
FIG. 1 is a block diagram showing a phase synchronizing circuit according to a first embodiment of the present invention.

A first embodiment of the present invention proposes the following circuit arrangement. FIG. 1 is a block diagram showing a phase-synchronizing circuit according to a first embodiment of the present invention.

In FIG. 1, an analog sine wave signal Sr which serves as a reference signal is inputted to an input terminal 1. The sine wave signal Sr is supplied to one input terminal of a phase detecting circuit 2 which detects direction and magnitude of a phase difference between two analog signals.

There is provided a memory 3 in which a waveform of a desired sine wave signal, for example, is stored in the form of a digital value. The memory 3 is supplied with a clock signal from an input terminal 4 and a read address signal from an address signal generating circuit 5, which will be described later on, whereby the waveform of the sine wave signal is read out from the memory. A thus read out digital sine wave signal Sd is developed at an output terminal 6.

Concurrently therewith, the sine wave signal Sd read out from the memory 3 is supplied to a D/A converting circuit 7, in which it is converted into an analog signal. An analog sine wave signal Sa is supplied to the other input terminal of the phase detecting circuit 2. The phase detecting circuit 2 detects direction and magnitude of a phase difference between the above two analog signals and supplies a phase difference signal (a) to the address signal generating circuit 5.

The address signal generating circuit 5 generates the read address signal as follows.

Specifically, the clock signal supplied to the input terminal 4 is supplied to a clock terminal of a counter 51 forming the address signal generating circuit 5. The phase detecting circuit 2 detects a phase difference between the two analog signals supplied thereto by a pulse width modulation (PWM) signal. Then, a detected phase difference signal (a) is supplied to an enable terminal (EN) of the counter 51.

Therefore, the counter 51 counts the clock signal supplied to the input terminal 4 during a period in which the phase difference signal from the phase detecting circuit 2 is held at high potential. The counter 51 is supplied with a clear (CLR) signal from a terminal 52, this clear signal indicating that the phase detecting circuit 2 detects the phase difference. A count value of the counter 51 is reset by the clear signal.

The count value from the counter 51 is supplied to a holding circuit 53. The holding circuit 53 is supplied with a strobe (STB) signal generated immediately before the above clear signal from a terminal 54. The holding circuit 53 holds the count value of the counter 51 in response to the strobe signal.

The count value of the clock signal corresponding to the high potential period of the phase difference signal, for example, and which is held in the holding circuit 53 is supplied to an adding circuit 55. The adding circuit 55 adds a predetermined value (−n), which will be described later on, from a terminal 56 to the above count value. An added value from the adding circuit 55 is supplied to an adding circuit 57. Then, the adding circuit 57 adds an arithmetic address value from the memory 3, for example, to the added value.

The arithmetic address value is obtained by arithmetic progression based on a ratio of the sampling rate of the digital sine wave signal Sd stored in the memory 3, for example, and the clock signal. Accordingly, this arithmetic address value can be previously stored in the memory 3, for example, and values stored in the memory 3 are sequentially read out and supplied to the adding circuit 57.

Then, the address value (count value+predetermined value (−n)+arithmetic address value)) added by the adding circuit 57 is supplied to the memory 3 and the above digital sine wave signal Sd is read out from the memory.

In this case, the count value and the predetermined value(−n) are updated each period of the analog sine wave signal Sr inputted to the input terminal 1, for example. On the other hand, the arithmetic address value is changed at every clock signal. When these values are added, a read address which is changed at every clock signal is formed and supplied to the memory 3.

In the above-mentioned circuitry, the phase detecting circuit 2 supplies a phase difference signal (a) shown in FIG. 2A, for example, is supplied to the counter 51. A strobe signal (STB) and a clear (CLR) signal shown in FIGS. 2B, 2C are supplied to the terminals 52, 54. Further, a clock (CLK) signal shown in FIG. 2D, for example, is supplied to the input terminal 4.

Accordingly, when the count value obtained from the counter 51 during the phase difference signal (a) is at high potential period is at (n), the adding circuit 55 outputs an added value of "0", whereby a read address signal beginning with the address value "0" is supplied to the memory 3. Then, the idigital sine wave signal Sd with a predetermined frequency synchronized with the clock signal, e.g., with reference phase, is read out from the memory 3.

The thus read out digital sine wave signal Sd is supplied to the output terminal 6 and supplied through the D/A converting circuit 7 to the phase detecting circuit 2. At that time, if the phase detecting circuit 2 outputs the phase difference signal (a) in which the clock signal of the high potential period goes to (n), then the adding circuit 55 outputs an added value of "0" and this circuit is stabilized in this state.

On the other hand, if the phase of the sine wave signal Sr inputted to the input terminal 1, for example, is delayed, then the output of the phase detecting circuit 2 is changed in such a manner that the duration of the high potential period of the phase difference signal (a), for example, is extended. As a result, the count value of the counter 51 increases to (n+Δ) and the adding circuit 55 outputs an added value of "+Δ".

As a result, a read address signal beginning with the address value "+Δ", for example, is outputted from the adding circuit 57 and supplied to the memory 3, whereby the digital sine wave signal Sd in which the stored digital sine wave signal Sd has the predetermined frequency synchronized with the clock signal and whose phase is shifted (delayed) by "+Δ" is read out from the memory 3.

If the phase of the sine wave signal Sr inputted to the input terminal 1, for example, is advanced, then the output of the phase detecting circuit 2 is changed such that the duration in which the phase difference signal (a), for example, is at high potential period is shortened. Thus, the count value of the counter 51 decreases to (n−Δ) and the adding circuit 55 outputs an added value of "−Δ".

Therefore, a read address signal beginning with the address value "−Δ", for example, is outputted from the adding circuit 57 and supplied to the memory 3, whereby the digital sine wave signal Sd in which the stored digital sine wave signal Sd has the predetermined frequency synchronized with the clock signal and whose phase is shifted (advanced) by "−Δ" is read out from the memory 3.

Specifically, the digital sine wave signal Sd shifted by the phase-changed amounts (±Δ) of the sine wave signal Sr inputted to the input terminal 1 is read out from the memory 3, whereby the digital sine wave signal Sd with phase synchronized with the sine wave signal Sr inputted to the input terminal 1 is supplied to the output terminal 6. This operation is repeatedly executed by resetting the count value of the counter 51 by the clear signal each time the phase detecting circuit 2 detects a phase difference signal.

FIG. 3 shows a manner in which the digital sine wave signal Sd is read out from the memory in actual practice.

Specifically, as shown in FIG. 3, only a waveform of ¼ period shown by a solid line is stored in the memory 3.

Then, when the digital sine wave signal Sd is read out from the memory, it is read out in the sequential order during the ¼ period of ①, it is read out with a time base reversed during the ¼ period of ②, it is read out with a polarity inverted during the ¼ period of ③, and it is read out with the time base reversed and with the polarity inverted during the ¼ period of ④. As a consequence, the digital sine wave signal Sd of one period is read out from the memory 3.

Moreover, if the read start position is shifted in response to the changes (±) of the phase of the sine wave signal Sr inputted to the input terminal 1, then the digital sine wave signal Sd synchronized with the phase of the sine wave signal Sr inputted to the input terminal 1 is developed at the output terminal 6.

In the above-mentioned circuitry, if the reference value (n) is set to ½ of the maximum count value of the counter 51, i.e., the maximum count value of the counter 51 is set to 2n, then the present invention can cope with the phase change ranging from −n to +n of the sine wave signal Sr inputted to the input terminal 1. Moreover, if a time period corresponding to a time period in which the maximum count value 2n is counted by the counter 51 is selected to be longer than one period of the sine wave signal, then the present invention can cope with the phase change of 360 degrees.

Further, in the above-mentioned circuitry, if the read position of the memory 3 is shifted by ¼ period on the whole, then a digital cosine wave signal can be phase-synchronized with the sine wave signal Sr inputted to the input terminal 1 and then developed. Furthermore, it is possible to phase-synchronize other signal than the above trigonometric function wave with an inputted signal by memorizing an arbitrary wave in the memory 3.

As described above, according to the above-mentioned circuitry, the signal stored in the memory means is read out, the inputted signal and the signal read out from the memory means are phase-compared with each other, and the read address signal for the memory means is controlled based on the detected phase error signal, whereby the phase of the read out signal is synchronized with that of the inputted signal. Therefore, it is possible to form a desired signal synchronized with the phase of the inputted signal with a simple arrangement by digital signal processing.

FIG. 4 shows a circuit arrangement for encoding a composite video signal by using the thus generated digital sine wave signal Sin and digital cosine wave signal Cos.

Specifically, as shown in FIG. 4, a luminance signal Y and two-axis color signals $C_B$, $C_R$ of a digital video signal, for example, are supplied through an input terminal 40 to a digital matrix circuit 41. This matrix circuit 41 outputs a luminance signal Y and color difference signals R-Y and B-Y from the above-mentioned signals. The outputted luminance signal Y is supplied to a digital NTSC encoder 42.

The color difference signal R-Y from the matrix circuit 41 is supplied to a multiplying circuit 43, in which it is multiplied with a digital sine wave signal Sin supplied to a terminal 44. Further, the color difference signal B-Y from the matrix circuit 41 is supplied to a multiplying circuit 45, in which it is multiplied with a digital cosine wave signal Cos supplied to a terminal 46. These multiplied signals are added by an adding circuit 47 and thereby a color subcarrier signal Sc is formed in a digital fashion.

Further, the color subcarrier signal Sc is supplied to the digital NTSC encoder 42, in which it is mixed with the above luminance signal Y to provide an NTSC composite video signal in a digital fashion. Then, this composite video signal is supplied to a D/A converting circuit 48, in which it is converted into an analog signal and then delivered to an output terminal 49.

In this manner, the composite video signal is encoded by using the digital sine wave signal Sin and the digital cosine wave signal Cos phase-synchronized with the signal supplied to the input terminal 1 of FIG. 1. Accordingly, the signal supplied to the input terminal 1 is converted to the color subcarrier wave of an arbitrary television signal, thereby forming a composite video signal phase-synchronized with the color subcarrier signal of the television signal. Thus, it becomes possible to synthesize these video signals.

Specifically, in this circuit, the digital video signal supplied to the input terminal 40, for example, can be phase-synchronized with the analog video signal supplied to the input terminal 1, for example, and encoded. Therefore, phase-synchronizing can be realized even in the situation in which the analog signal and the digital signal are provided in the mixed state.

FIG. 5 is a block diagram showing a phase synchronizing circuit according to a second embodiment of the present invention. In FIG. 5, like parts corresponding to those of FIG. 1 are marked with the same references and therefore need not be described one more time.

Specifically, in the circuit according to the second embodiment, in the address signal generating circuit 5, the clock signal supplied to the above-mentioned input terminal 4 is supplied to the clock terminal 6 of a counter 61 forming the address signal generating circuit 5. The phase difference signal (a) (PWM signal) from the above-mentioned phase detecting circuit 2 is supplied to an up/down control terminal (U/D) of the counter 61.

Thus, the counter 61 counts the clock signal supplied to the input terminal 4 in an ascending order during the period in which the phase difference signal from the phase detecting circuit 2 is at high potential and counts the clock signal supplied to the input terminal 4 in a descending order during the period in which the phase difference signal is at low potential. The counter 61 is supplied with the clear (CLR) signal indicating that the phase detecting circuit 2 detects the phase difference signal from a terminal 62, for example. Then, the count value of the counter 61 is reset by the clear signal.

The count value counted by the counter 61 is supplied to the holding circuit 63. The holding circuit 63 is supplied with the strobe (STB) signal generated immediately before the clear signal, for example, from a terminal 64. The holding circuit 63 holds the count value of the counter 61 in response to the strobe signal.

The count value of the clock signal held by the holding circuit 63 and which is equivalent to the high potential period of the phase difference signal, for example, is supplied to an adding circuit 65. The adding circuit 65 adds the arithmetic address value from the memory 3 to the count value. An address value (count value+arithmetic address value) added by the adding circuit 65 is supplied to the memory 3 and thereby the digital sine wave signal Sd is read out from the memory.

Figure 6A:
FIG. 6 is a timing chart used to explain a manner in which an address generating circuit of FIG. 5 generates an address signal.

In the above-mentioned circuitry, a phase difference signal (a) shown in FIG. 6A is supplied from the phase detecting circuit 2 to the counter 61. A strobe (STB) signal and a clear (CLR) signal shown in FIGS. 6B, 6C are supplied to terminals 62, 64. Further, a clock (CLK) signal shown in FIG. 6D is supplied to the input terminal 4.

Accordingly, when the durations of the high potential period and the low potential period of the phase difference signal (a), for example, are equal, the count value of the counter 61 is set to "0", whereby the read address signal beginning with the address value "0", for example, is supplied to the memory 3. Then, the stored digital sine wave signal Sd with a predetermined frequency synchronized with the clock signal and with a reference phase is read out from the memory 3.

Further, the thus read out digital sine wave signal Sd is outputted to the output terminal 6 and supplied through the D/A converting circuit 7 to the phase detecting circuit 2. Then, at that time, so long as the phase difference signal (a) in which the durations of the high potential period and the low potential period are equal to each other is outputted from the phase detecting circuit 2, the count value of the counter 61 remains as "0" so that this circuit is stabilized in this state.

On the other hand, when the sine wave signal Sr inputted to the input terminal 1, for example, is delayed, the output of the phase detecting circuit 2 is changed such that the duration of the high potential period of the phase difference signal (a) is extended. As a result, the counter 61 outputs an added value of "+$\Delta$".

As a result, the read address signal beginning with the address value of "+$\Delta$" is outputted from the adding circuit 65 and supplied to the memory 3, whereby the digital sine wave signal Sd in which the stored digital sine wave signal Sd has a predetermined frequency synchronized with the clock signal and whose phase is shifted (delayed) by "+$\Delta$" is read out from the memory 3.

When the phase of the sine wave signal Sr inputted to the input terminal 1, for example, is advanced, the output of the phase detecting circuit 2 is changed such that the duration in which the phase difference signal (a) is held at low potential period is extended. As a result, the counter 61 outputs an added value of "-$\Delta$".

The read address signal beginning with the address value "-$\Delta$" is outputted from the adding circuit 65 and supplied to the memory 3, whereby the digital sine wave signal Sd in which the stored digital sine wave signal Sd has a predetermined frequency synchronized with the clock signal and whose phase is shifted (advanced) by "-$\Delta$" is read out from the memory 3.

Specifically, the digital sine wave signal Sd shifted by the changed amounts (±$\Delta$) of the phase of the sine wave signal Sr inputted to the input terminal 1 is read out from the memory 3, whereby the digital sine wave signal Sd synchronized with the phase of the sine wave signal Sr inputted to the input terminal 1 is outputted to the output terminal 6. Then, this operation is repeatedly executed by resetting the count value of the counter 61 by the clear signal each time the phase detecting circuit 2 detects the phase difference signal.

As described above, also in the circuit according to the second embodiment, the signal stored in the memory means is read out, the inputted signal and the signal read out from the memory means are phase-compared with each other, and the read address signal for the memory means is controlled based on the detected phase error signal, whereby the phase of the read out signal is synchronized with that of the inputted signal. Therefore, a desired signal synchronized with the phase of the inputted signal can be formed with a simple arrangement by digital signal processing.

FIG. 7 is a block diagram showing an arrangement of a phase synchronizing circuit according to a third embodiment of the present invention. In FIG. 7, like parts corresponding to those of FIG. 1 are marked with the same references and therefore need not be described in detail.

Specifically, in the circuit according to the third embodiment, in the address signal generating circuit 5, the arrangement of the above phase detecting circuit 2 is varied, in this embodiment, the phase detecting circuit 21 detects magnitude of phase difference between the two analog signals supplied thereto by the pulse number modulated (PNM) signal and the U/D signal indicative of the direction of the phase difference. Then, this phase difference signal (a) (PNM signal) is supplied to the clock terminal of the counter 71 composing the address signal generating circuit 5 and the U/D signal is supplied to the up/down control terminal (U/D).

As a result, this counter 71 counts clock signals in an ascending order and in a descending order in response to the magnitude and direction of the phase difference between the two analog signal supplied to the phase detecting circuit 21, for example. This counter 71 is supplied with the clear (CLR) signal when the number of pulses of the PNM signal of the phase detecting circuit 21 from the terminal 72, for example, reaches $2^m$. The count value of the counter 71 is reset by this clear signal.

Further, the count value counted by the counter 71 is supplied to the holding circuit 73. The strobe (STB) signal formed immediately before the above-mentioned clear signal is supplied from a terminal 74, for example, to the holding circuit 73. The count value of the counter 71 at that time is held by the holding circuit 73 by this strobe signal.

The count value of the counter 71 held in the holding circuit 73 is supplied to an adding circuit 75 and the adding circuit 75 adds the arithmetic address value from the memory 3 to the count value. Then, an address value (count value+arithmetic address value) added by the adding circuit 75 is supplied to the memory 3 from which the above-mentioned digital sine wave signal Sd is read out.

Then, in the above-mentioned circuit, the phase detecting circuit 21 supplies a U/D signal and a phase difference signal (a) shown in FIGS. 8A, 8B to the counter 71. A strobe (STB) signal and a clear (CLR) signal shown in FIGS. 8C, 8D, for example, are supplied to terminals 72, 74.

Accordingly, when the number of pulses of the phase difference signal (a) obtained during the high potential period and the low potential period of the U/D signal, for example, are equal to each other, the count value of the counter 71 is reset to "0". Thus, the read address signal beginning with the address value "0" is supplied to the memory 3. Then, the stored digital sine wave signal Sd with a predetermined frequency synchronized with the clock signal and with a reference phase is read out from the memory 3.

The thus read out digital sine wave signal Sd is outputted to the output terminal 6 and supplied through the D/A converting circuit 7 to the phase detecting circuit 21. Then, at that time, so long as the phase difference signal (a) in which the U/D signals are equal to each other during the high potential period and the low potential period is outputted from the phase detecting circuit 21, then the count value of the counter 71 is left as "0" so that this circuit is stabilized in this state.

On the other hand, when the phase of the sine wave signal Sr inputted to the input terminal 1 is delayed, the output of the phase detecting circuit 21 is changed such that the number of pulses of the phase difference signal (a) obtained during the U/D signal, for example, is held at the high potential period increases. Thus, the counter 71 outputs an added value of "+$\Delta$".

As a result, the read address signal beginning with the address value "+Δ", for example, is outputted from the adding circuit 75 and supplied to the memory 3, whereby the digital sine wave signal Sd in which the stored digital sine wave signal Sd has a predetermined frequency synchronized with the clock signal and whose phase is shifted (delayed) by "+Δ" is read out from the memory 3.

When the phase of the sine wave signal Sr inputted to the input terminal 1, for example, is advanced, the output of the phase detecting circuit 21 is changed such that the number of pulses of the phase difference signal obtained when the U/D signal is at low potential increases. As a consequence, the counter 71 outputs an added value of "−Δ".

Therefore, the read address signal beginning with the address value of "−Δ" is outputted from the adding circuit 75 and supplied to the memory 3. As a result, the digital sine wave signal Sd in which the stored digital sine wave signal Sd has a predetermined frequency synchronized with the clock signal and whose phase is shifted (advanced) by "−Δ" is read out from the memory 3.

Specifically, the digital sine wave signal Sd shifted by the changed amounts (±Δ) of the phase of the sine wave signal Sr inputted to the input terminal 1 is read out from the memory 3, whereby the digital sine wave signal Sd synchronized with the phase of the sine wave signal Sr inputted to the input terminal 1 is outputted to the output terminal 1. This operation is repeatedly executed by resetting the count value of the counter 71 by the clear signal each time the phase detecting circuit 2 detects the phase difference signal.

In this manner, also in the circuit according to the third embodiment, the signal stored in the memory means is read out, the inputted signal and the signal read out from the memory means are phase-compared, and the phase of the read-out signal is synchronized with that of the inputted signal by controlling the read address signal of the memory means based on the detected phase error signal. Therefore, a desired signal synchronized with the phase of the inputted signal can be formed with a simple arrangement by digital signal processing.

Therefore, using the phase-synchronizing method and circuit according to the present invention, it is possible to form a desired signal synchronized the phase of the inputted signal with the simple arrangement by digital signal processing.

While the embodiments of the present invention have been described so far with reference to the case that the composite video signals, for example, are synthesized, the present invention can be applied to the case that a digital signal whose phase is synchronized by other circuits and apparatus. It is needless to say that the present invention can be variously modified without departing from the gist of the present invention.

We claim:

1. A phase synchronizing circuit, comprising:

input means to which an arbitrary frequency signal is inputted;

memory means in which a desired signal waveform is stored;

address signal generating means for generating an address signal used to read out said desired signal waveform from said memory means; and phase-comparing means for comparing a chase of said desired signal waveform and a phase of said arbitrary frequency signal inputted to said input means, wherein a signal of said desired signal waveform whose phase is synchronized with that of said arbitrary frequency signal inputted to said input means is read out from said memory means by controlling said address signal generated by said address signal generating means based on a phase error signal obtained from said phase comparing means, said address signal generating means generating said address signal by computing a reference address signal and an error address signal formed from said phase error signal, wherein said phase error signal is a pulse width modulated signal and said address signal generating means includes a counter circuit for counting a clock signal by said pulse width modulated signal, a holding circuit for holding a count value of said counter circuit and a computing circuit for computing said reference address signal and said count value held in said holding circuit.

2. The phase synchronizing circuit as claimed in claim 1, in which said counter circuit counts said clock signal in an ascending order when said pulse width modulated signal has one polarity and counts said clock signal in a descending order when said pulse width modulated signal has the other polarity.

3. A phase synchronizing circuit, comprising:

input means to which an arbitrary frequency signal is inputted;

memory means in which a desired signal waveform is stored;

address signal generating means for generating an address signal used to read out said desired signal waveform from said memory means; and phase-comparing means for comparing a phase of said desired signal waveform and a phase of said arbitrary frequency signal inputted to said input means, wherein a signal of said desired signal waveform whose phase is synchronized with that of said arbitrary frequency signal inputted to said input means is read out from said memory means by controlling said address signal generated by said address signal generating means based on a phase error signal obtained from said phase comparing means, said address signal generating means generating said address signal by computing a reference address signal and an error address signal formed from said phase error signal, wherein said phase error signal comprises a pulse number modulated signal indicative of magnitude of phase error and an up/down signal indicative of direction of phase error and said phase synchronizing circuit includes a counter circuit for counting said pulse number modulated signal in an ascending order when said up/down signal has one polarity and counts said pulse number modulated signal in a descending order when said up/down signal has the other polarity, a holding circuit for holding a count value of said counter circuit, and a computing circuit for computing said reference address signal and said count value held in said holding circuit.

* * * * *